United States Patent
Cheng

(10) Patent No.: US 9,502,447 B2
(45) Date of Patent: Nov. 22, 2016

(54) ARRAY SUBSTRATE AND MANUFACTURING METHOD THEREOF, DISPLAY DEVICE

(71) Applicant: BOE TECHNOLOGY GROUP CO., LTD., Beijing (CN)

(72) Inventor: Hongfei Cheng, Beijing (CN)

(73) Assignee: BOE Technology Co., Ltd., Beijing (CN)

( * ) Notice: Subject to any disclaimer, the term of this patent is extended or adjusted under 35 U.S.C. 154(b) by 0 days.

(21) Appl. No.: 14/358,444

(22) PCT Filed: Nov. 13, 2013

(86) PCT No.: PCT/CN2013/087078
§ 371 (c)(1),
(2) Date: May 15, 2014

(87) PCT Pub. No.: WO2015/027569
PCT Pub. Date: Mar. 5, 2015

(65) Prior Publication Data
US 2015/0221674 A1    Aug. 6, 2015

(30) Foreign Application Priority Data

Aug. 27, 2013   (CN) .......................... 2013 1 0379214

(51) Int. Cl.
*H01L 27/12*    (2006.01)
(52) U.S. Cl.
CPC ........... *H01L 27/127* (2013.01); *H01L 27/124* (2013.01); *H01L 27/1222* (2013.01); *H01L 27/1225* (2013.01); *H01L 27/1248* (2013.01)

(58) Field of Classification Search
CPC ............... H01L 27/127; H01L 27/1225; H01L 27/1248; H01L 27/124; H01L
(Continued)

(56) References Cited

U.S. PATENT DOCUMENTS 5,622,814 A *   4/1997 Miyata et al. ................ 430/314
2002/0056838 A1  5/2002 Ogawa
(Continued)

FOREIGN PATENT DOCUMENTS

CN          1353329 A      6/2002
CN        102629577 A      8/2012
(Continued)

OTHER PUBLICATIONS

English Translation of the International Search Report of PCT/CN2013/087078 published in English on Mar. 5, 2015.
(Continued)

*Primary Examiner* — William F Kraig
*Assistant Examiner* — Stanetta Isaac
(74) *Attorney, Agent, or Firm* — Collard & Roe, P.C.

(57) ABSTRACT

An array substrate comprises a base substrate, a gate line, a data line and a thin film transistor arranged in an array on the base substrate, a pixel electrode and a passivation layer, the thin film transistor include a gate electrode, an active layer, a source electrode and a drain electrode, and the pixel electrode and the active layer, the drain are disposed in a same layer and formed integrally. A display device comprising the array substrate and a manufacturing method of the array substrate are further disclosed.

13 Claims, 8 Drawing Sheets

(58) Field of Classification Search
CPC ............... 27/1222;H01L 21/16–21/168; H01L 29/242; H01L 29/7869; H01L 2924/1067; H01L 2924/10471; H01L 21/024; H01L 27/12; H01L 29/786; H01L 2021/775; H01L 29/66742; H01L 29/8086; H01L 29/8126; H01L 29/78654; H01L 29/04; H01L 27/1214; H01L 27/1207
See application file for complete search history.

(56) References Cited

U.S. PATENT DOCUMENTS

| | | | |
|---|---|---|---|
| 2008/0265254 A1 | 10/2008 | Nishiura | |
| 2009/0236605 A1* | 9/2009 | Qiu et al. | 257/72 |
| 2010/0295049 A1* | 11/2010 | Yoo et al. | 257/59 |
| 2011/0260157 A1* | 10/2011 | Yano | H01L 27/1225 257/43 |
| 2014/0077160 A1* | 3/2014 | Dai et al. | 257/29 |

FOREIGN PATENT DOCUMENTS

| | | |
|---|---|---|
| CN | 103021939 A | 4/2013 |
| CN | 203445120 U | 2/2014 |
| KR | 2002-0038482 A | 5/2002 |
| KR | 20080041018 A | 5/2008 |

OTHER PUBLICATIONS

International Search Report and Written Opinion of the International Searching Authority with Notice of Transmittal of the International Search Report and Written Opinion of PCT/CN2013/087078 in Chinese, mailed Jun. 3, 2014.
Chinese Office Action of Chinese Application No. 201310379214.X, mailed May 28, 2015 with English translation.
Korean Office Action of Korean Application No. 10-2014-7014737, mailed Jun. 1, 2015 with English translation.
Second Chinese Office Action of Chinese Application No. 201310379214.X, mailed Jan. 12, 2016 with English translation.
Korean Office Action of Korean Application No. 10-2014-7014737, mailed Nov. 26, 2015 with English translation.
English translation of the International Preliminary Report on Patentability and Written Opinion of the International Searching Authority of PCT/CN2013/087078, issued Mar. 1, 2016.

* cited by examiner

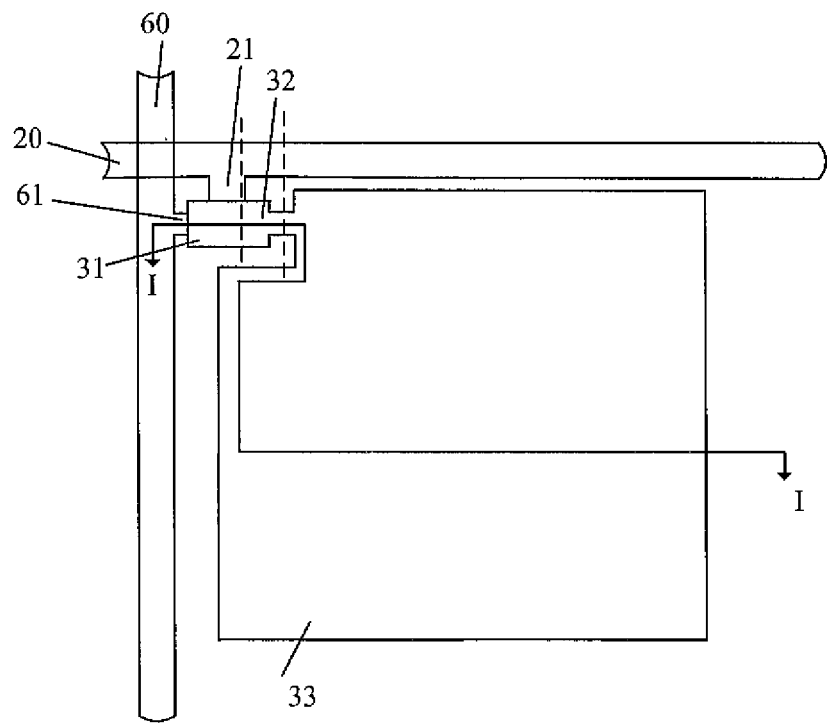
FIG. 1
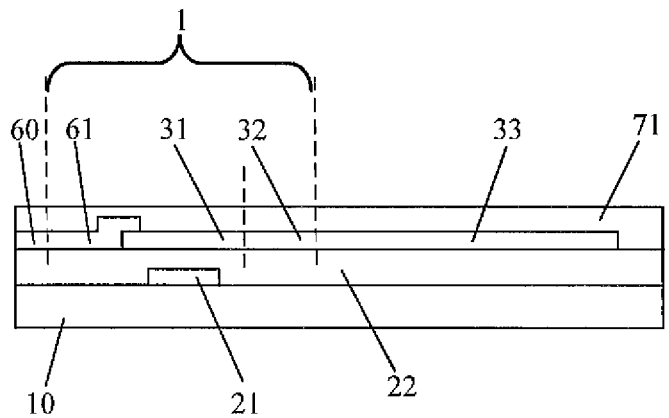
FIG. 2
| forming a pattern comprising an active layer, a drain electrode and a pixel electrode, the active layer, the drain electrode and the pixel electrode being disposed in the same layer as and formed integrally | S301 |
FIG. 3

ARRAY SUBSTRATE AND MANUFACTURING METHOD THEREOF, DISPLAY DEVICE

CROSS REFERENCE TO RELATED APPLICATIONS

This application is the National Stage of PCT/CN2013/087078filed on Nov. 13, 2013, which claims priority under 35 U.S.C. §119 of Chinese Application No. 201310379214.X filed on Aug. 27, 2013, the disclosure of which is incorporated by reference. The international application under PCT article 21(2) was not published in English.

TECHNICAL FIELD

Embodiments of the present invention relate to an array substrate and a manufacturing method thereof, and a display device.

BACKGROUND

Liquid crystal displays are a kind of flat and ultra-thin display devices with advantages such as small volume, small thickness, light weight, small energy dissipation and low radiation and are widely applied in various electronic display devices. The display effect of a liquid crystal display is mainly determined by the liquid crystal display panel that mainly comprises an array substrate, a color filter substrate and a liquid crystal molecule layer between the two substrates. The array substrate determines the response time and the display effect of the liquid crystal display panel to a large extent.

On the array substrate are generally included structures such as thin film transistors and pixel electrodes; and a thin film transistor specifically comprises structures such as a gate electrode, an active layer, a source electrode and a drain electrode. In the manufacturing process of the array substrate for a bottom-gate type thin film transistor, typically five patterning processes are required to form gate electrodes, active layers, source electrodes and drain electrodes, drain electrode via holes, and pixel electrodes respectively. Manufacturing of the array substrate for a top-gate type thin film transistor requires more complex patterning process to form various layer structures.

SUMMARY

Embodiments of the present invention provide an array substrate and a manufacturing method thereof, as well as a display device which can simplify the structure of the array substrate, reduce the number of patterning processes in the manufacturing process of the array substrate, and improve yield of the array substrates.

An aspect of the present invention provides an array substrate, which comprises a base substrate, a gate line, a data line and a thin film transistor arranged in an array on the base substrate, a pixel electrode and a passivation layer, the thin film transistor comprising a gate electrode, an active layer, a source electrode and a drain electrode; the pixel electrode and the active layer, the drain electrode are disposed in a same layer and formed integrally.

For example, the thin film transistor is a bottom-gate type thin film transistor, the array substrate comprises: the gate line and the gate electrode on the base substrate; a first insulating layer on the gate line and the gate electrode; the active layer, the drain electrode and the pixel electrode on the first insulating layer; the data line and the source electrode on the active layer, the drain electrode and the pixel electrode; and the passivation layer on the data line and the source electrode; the source electrode of the thin film transistor is connected with the active layer.

For example, the thin film transistor is a top-gate type thin film transistor, the array substrate comprises: the active layer, the drain electrode and the pixel electrode on the base substrate; a first insulating layer on the active layer, the drain electrode and the pixel electrode; the gate line and the gate on the first insulating layer; a second insulating layer on the gate line and the gate electrode; the data line and the source electrode on the second insulating layer; and the passivation layer on the data line and the source electrode; the first insulating layer and the second insulating layer are provided therein with a via hole corresponding to the active layer, and the source electrode of the thin film transistor is connected with the active layer through the via hole.

For example, the thin film transistor is a bottom-gate type thin film transistor and the passivation layer may further include an opening corresponding to the pixel electrode.

For example, the thin film transistor is a top-gate type thin film transistor and the first insulating layer, and the second insulating layer and the passivation layer may further include an opening corresponding to the pixel electrode.

For example, the array substrate may further include a common electrode on the passivation layer.

For example, the common electrodes have slits therein.

For example, a material for the active layer, the drain electrode and the pixel electrode may be an oxide semiconductor material; and a thickness of the active layer, the drain electrode and the pixel electrode is from 20 Å to 1000 Å.

The pixel electrode, the active layer and the drain electrode on the array substrate are disposed in the same layer and formed integrally, which simplifies the structure of the array substrate and thereby can effectively reduce the number of patterning processes, hence saving costs, and at the same time further avoid alignment error among multiple patterning processes and improve yield of the array substrate. The display panel applying the array substrate can have better display effect.

Another aspect of the present invention further provides a display device comprising any array substrate as described above.

Yet another aspect of the present invention further provides a manufacturing method of an array substrate comprising a base substrate, a gate line, a data line, a thin film transistor arranged in an array on the base substrate, a pixel electrode and a passivation layer, the thin film transistor comprising a gate electrode, an active layer, a source electrode and a drain electrode; the method comprises forming a pattern comprising the active layer, and the drain electrode and the pixel electrode; and the pixel electrode, the active layer, the drain electrode are disposed in a same layer and formed integrally.

For example, the thin film transistor is a bottom-gate type thin film transistor and the manufacturing method further comprises: forming a pattern comprising the gate line and the gate electrode on the base substrate; forming a first insulating layer on the patterns of the gate line and the gate electrode; forming a pattern of the active layer, the drain electrode and the pixel electrodes on the first insulating layer; forming a pattern comprising the data line and the source electrode on the pattern of the active layer, the drain electrode and the pixel electrode, the source electrode being connected with the active layer; and forming the passivation layer on the pattern of the data line and the source electrode.

For example, the thin film transistor is a top-gate type thin film transistor and the manufacturing method further comprises: forming a pattern of the active layer, the drain electrode and the pixel electrodes on the base substrate; forming a first insulating layer on the pattern of the active layer, the drain electrode and the pixel electrode; forming a pattern comprising the gate line and the gate electrode on the first insulating layer; forming a second insulating layer on the pattern of the gate line and the gate electrode, the first insulating layer and the second insulating layer being provided therein with a via hole corresponding to the active layer; forming a pattern comprising the data line and the source electrode on the second insulating layer, the source electrode being connected with the active layer through the via hole; forming the passivation layer on the pattern of the data line and the source electrode.

For example, the thin film transistor may be a bottom-gate type thin film transistor and then the manufacturing method may further comprise: forming an opening corresponding to the pixel electrode in the passivation layer.

For example, the thin film transistor may be a top-gate type thin film transistor and then the manufacturing method may further comprise: forming an opening corresponding to the pixel electrode in the first insulating layer, the second insulating layer and the passivation layer.

For example, the manufacturing method may further comprise: forming a pattern of a common electrode on the passivation layer.

For example, the manufacturing method may further comprise: forming slits in the common electrode.

For example, the active layer, the drain electrode and the pixel electrode are formed of a metal oxide semiconductor material; and a thickness of the active layer, the drain electrode and the pixel electrode is from 20 Å to 1000 Å.

With this manufacturing method, an array substrate may be manufactured with less number of patterning processes, resulting in a simple process and low costs, which reduces alignment error in the manufacturing process of the array substrate and realizes high yield of the manufactured array substrate.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

FIG. 1 is a plan view of an array substrate for a bottom-gate type thin film transistor in an embodiment of the present invention;

FIG. 2 is a sectional view along I-I' direction of the array substrate for a bottom-gate type thin film transistor illustrated in FIG. 1 in an embodiment of the present invention;

FIG. 3 is a flow chart of a manufacturing method of the array substrate in an embodiment of the present invention;

REFERENCE NUMERALS

Figure 4:
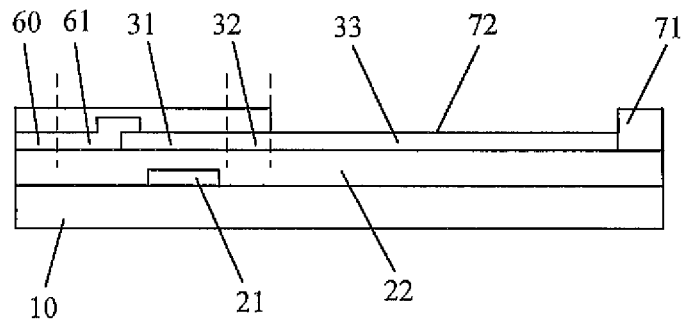
FIG. 4 is a schematic diagram of an array substrate for another bottom-gate type thin film transistor in an embodiment of the present invention.

1—Thin film transistor; 10—Base substrate; 20—Gate line;
21—Gate Electrode; 22—First insulating layer; 31—Active layer;
32—Drain Electrode; 33—Pixel electrode; 41—Second insulating layer;
51—Via hole; 60—Data line; 61—Source Electrode;
71—Passivation layer; 72—Opening; 81—Common Electrode.

DETAILED DESCRIPTION

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

The inventor found in study that a traditional array substrate requires multiple patterning processes for manufacturing due to its complex structure, which leads to high costs, and decreases yield of the array substrate due to the alignment error among multiple patterning processes.

Embodiment I

The present embodiment provides an array substrate. As illustrated in FIGS. 1 and 2, the array substrate comprises a base substrate 10, gate lines 20, data lines 60 and thin film transistors 1 arranged in an array on the base substrate, pixel electrodes 33, and a passivation layer 71. The gate lines 20 and the data lines 60 intersect each other to define pixel units. The thin film transistors 1 and the pixel electrodes 33 are provided in pixel units. The thin film transistor 1 comprises a gate electrode 21, an active layer 31, a source electrode 61 and a drain electrode 32; and the pixel electrodes 33, the active layer 31, and the drain electrode 32 are disposed in the same layer and formed integrally.

The pixel electrode, the active layer and the drain electrode of each pixel unit on the array substrate are disposed in the same layer and formed integrally, which simplifies structure of the array substrate and can effectively reduce the number of patterning processes and therefore saves costs in the manufacturing process of the array substrate. At the same time, this structure can further avoid alignment error problem among multiple patterning processes, which improves yield of the array substrate, and a display panel utilizing this array substrate has better display effect.

The active layer 31, the drain electrode 32 and the pixel electrode 33 disposed in the same layer may be of the same kind of metal oxide semiconductor. In a traditional technology, polysilicon, non-crystalline silicon are generally used for the active layer, metals such as chromium, molybdenum, copper are generally used for the drain electrode, transparent conductive materials such as indium tin oxide (ITO) and indium zinc oxide (IZO) are generally used for the pixel electrode. In this embodiment, the same kind of metal oxide semiconductor is used for the active layer 31, the drain electrode 32 and the pixel electrode 33, which can have good electrical conductivity within the operating voltage range of the liquid crystal display panel, and has good light transmittance at the same time, and therefore can satisfy the performance requirement for the material selected for the active layer 31, the drain electrode 32 and the pixel electrode 33 at the same time. The metal oxide semiconductor used in embodiments of the present invention may be a transparent metal oxide semiconductor material, such as non-crystalline indium gallium zinc oxide, indium zinc oxide, zinc oxide, titanium oxide, tin oxide, cadmium stannate or the like metal oxides.

Furthermore, as illustrated in FIG. 1, the thin film transistor unit 1 that uses a metal oxide semiconductor as its active layer 31 and the drain electrode 32 is located at an intersection of a gate line 20 and a data line 60. For example, gate lines 20 and gate electrodes 21 of the array substrate are disposed in the same layer and are formed integrally, and data lines 60 and source electrodes 61 of the array substrate are disposed in the same layer and formed integrally. The part of a data line 60 that contacts an active layer 31 functions as the source electrode 61 of the thin film transistor unit 1.

It is to be noted that relative positions of the active layer 31, the drain electrode 32 and the pixel electrode 33 are not limited to the positions divided by the broken lines in FIGS. 1 and 2. Specific relative positions of them may be modified according to actual situations, which is not specifically limited in embodiments of the present invention.

Similarly, shapes of the active layer 31, the drain electrode 32 and the pixel electrode 33 are not limited to those illustrated in FIGS. 1 and 3, which may be modified according to actual situations. For example, the pixel electrode 33 may have slits (or openings) therein, and the edge of the pixel electrode 33 may be of zigzag form or the pixel electrode 33 may have other fine patterns.

Furthermore, the thickness of the active layer 31, the drain electrode 32 and the pixel electrode 33 disposed in the same layer is for example from 20 Å to 1000 Å (20~1000 Å). The thickness of the active layer 31, the drain electrode 32 and the pixel electrode 33 may be modified according to actual situations, which is not limited in embodiments of the present invention.

Furthermore, another embodiment of the present invention provides a display device comprising the array substrate as mentioned above. The display device may be any product or component with display function, such as a liquid crystal panel, electronic paper, organic light emitting diode panel, a cellphone, a flat computer, a TV set, a display, a notebook computer, a digital picture frame or a navigator.

Embodiment II

The present embodiment further provides a manufacturing method of an array substrate comprising a base substrate, gate lines, data lines, thin film transistors arranged in an array on the base substrate, pixel electrodes and a passivation layer, in which the thin film transistor comprises a gate electrode, an active layer, a source electrode and a drain electrode. As illustrated in FIG. 3, the manufacturing method may be implemented as follows.

Step S301, forming a pattern comprising an active layer, a drain electrode and a pixel electrode, the active layer, the drain electrode and the pixel electrode being disposed in the same layer as and formed integrally.

First, a layer of metal oxide semiconductor layer with a thickness of preferably 20-1000 Å is formed on the array substrate by for example a sputtering method. The metal oxide semiconductor may be a transparent metal oxide semiconductor material such as non-crystalline indium gallium zinc oxide, indium zinc oxide, zinc oxide, titanium oxide, tin oxide, cadmium stannate or the like metal oxides.

Secondly, a layer of photoresist is coated on the metal oxide semiconductor layer, exposed with a mask with patterns of the active layer 31, the drain electrode 32 and the pixel electrode 33, and developed to obtain the photoresist pattern, which is used to etch the metal oxide semiconductor layer to conduct one patterning process, forming the active layer 31, the drain electrode 32 and the pixel electrode 33 that are disposed in the same layer on the array substrate. The formed active layer 31, drain electrode 32 and pixel electrode 33 are disposed in the same layer and formed integrally.

Similarly, gate lines 20 and gate electrodes 21 of the array substrate are disposed in the same layer and are formed integrally, and data lines 60 and source electrodes 61 of the array substrate are disposed in the same layer and formed integrally.

The manufacturing method in the present embodiment comprises forming a pattern comprising an active layer, a drain electrode and a pixel electrode disposed in the same layer and formed integrally. With this manufacturing method, an array substrate may be manufactured with less number of patterning processes, resulting in a simple process and low costs, which reduces alignment error among the manufacturing processes of the array substrate and realizes high yield of the manufactured array substrate.

Embodiment III

The present embodiment provides an array substrate on which thin film transistors are provided, and the thin film transistors may be bottom-gate type thin film transistors or top-gate type thin film transistors. For different types of thin film transistors disposed on the array substrate, the structures and manufacturing methods of the array substrate are also different from each other.

The present embodiment provides an array substrate comprises a bottom-gate type thin film transistor, as illustrated in FIGS. 1 and 2. The array substrate comprises: gate lines 20 and gate electrodes 21 on the base substrate 10; a first insulating layer 22 on the gate lines 20 and the gate electrodes 21; active layers 31, drain electrodes 32 and pixel electrodes 33 on the first insulating layer 22; data lines 60 and source electrodes 61 on the active layer 31, drain electrodes 32 and pixel electrodes 33, in which source electrodes 61 of the thin film transistors 1 are connected with the active layers 31; and a passivation layer on the data lines 60 and the source electrodes 61. More specifically, the structure of the array substrate is as described below.

The base substrate 10 may be a glass substrate or a plastic substrate with good light transmittance.

Gate lines 20 and gate electrodes 21 on the base substrate 10 may be of a single-layer structure or a multi-layer structure. When the gate lines 20 and gate electrodes 21 are of a single-layer structure, they may be formed of a material such as copper, aluminum, silver, molybdenum, chromium, neodymium, nickel, manganese, titanium, tantalum, or tungsten or any alloy of the above elements. When gate lines 20 and gate electrodes 21 are of a multi-layer structure, they may be formed of a lamination structure of copper\titanium, copper\molybdenum, or molybdenum\aluminum\molybdenum. The thickness of gate lines 20 and gate electrodes 21 may be from 2500 Å to 16000 Å. The gate lines 20 and the gate electrodes 21 may be disposed on the base substrate 10 directly, or a buffer layer may be disposed between the gate lines 20 and gate electrodes 21 and the base substrate 10, and may be of for example silicon nitride or silicon oxide.

The first insulating layer 22 on the gate lines 20 and gate electrodes 21 may be of a material such as silicon nitride, silicon oxide or silicon oxynitride, and may be of a single-layer structure or a two-layer structure of silicon nitride or silicon oxide. The thickness of the first insulating layer 22 in the embodiments of the present invention is preferably from 2000 Å to 6000 Å.

An active layer 31, a drain electrode 32 and a pixel electrode 33 disposed in the same layer on the first insulating layer 22 may be of a same metal oxide semiconductor, for example, a transparent metal oxide semiconductor material such as non-crystalline indium gallium zinc oxide, indium zinc oxide, zinc oxide, titanium dioxide, tin oxide, cadmium stannate or the like metal oxides. Furthermore, the thickness of the active layer 31, the drain electrode 32 and the pixel electrode 33 disposed in the same layer is for example from 20 Å to 1000 Å.

Data lines 60 and source electrodes 61 on the active layer 31, the drain electrodes 32 and the pixel electrodes 33 may be of a single-layer structure or a multi-layer structure. When the data lines 60 and source electrodes 61 are of a single-layer structure, they may be formed of a material such as copper, aluminum, silver, molybdenum, chromium, neodymium, nickel, manganese, titanium, tantalum, or tungsten or any alloy of the above elements. When data lines 60 and source electrodes 61 are of a multi-layer structure, they may be formed of a copper\titanium multi-layered structure, a copper\molybdenum multi-layered structure, or a molybdenum\aluminum\molybdenum multi-layered structure. Furthermore, the thickness of data lines 60 and source electrodes 61 may be from 2000 Å to 6000 Å.

The passivation layer 71 on the data lines 60 and the source electrodes 61 may be of a single-layer structure of silicon nitride, silicon oxide or silicon oxynitride or may be of a two-layer structure of silicon nitride or silicon oxide. Furthermore, the material for the passivation layer 71 may also be organic resin, such as acrylic resin, polyimide, or polyamide. The thickness of the passivation layer 71 is preferably from 200 Å to 5000 Å.

Furthermore, as illustrated in FIG. 4, in order to reduce the thickness between the pixel electrodes 33 and the liquid crystal molecule layer and further lower the operating voltage for driving liquid crystal molecules, openings 72 corresponding to the pixel electrodes 33 may be disposed in the passivation layer 71.

Figure 5:
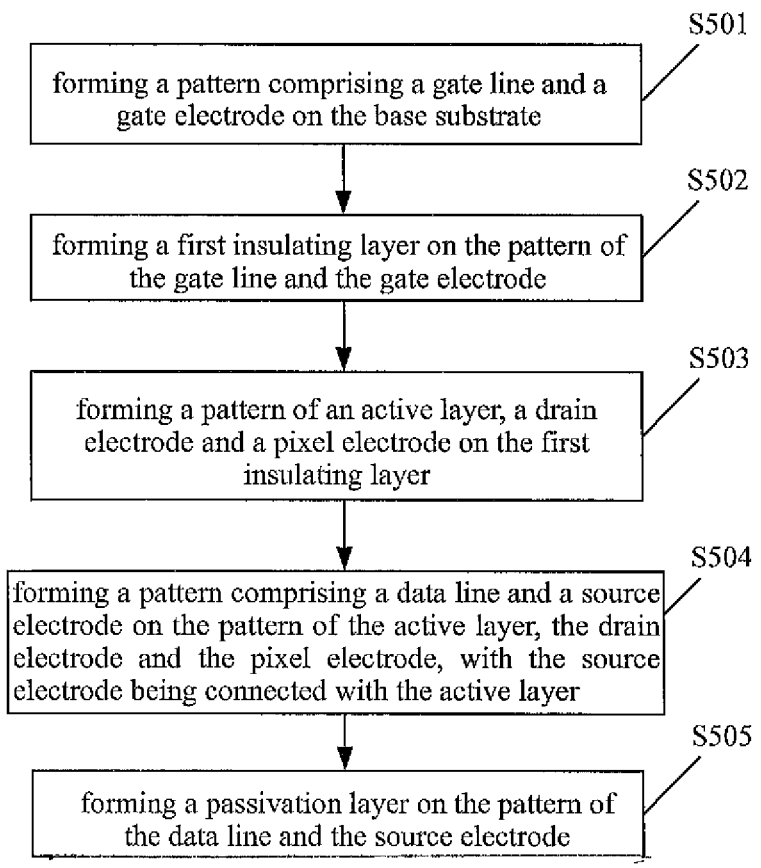
FIG. 5 is a flow chart of a manufacturing method of an array substrate for a bottom-gate type thin film transistor in an embodiment of the present invention.

An embodiment of the present invention further provides a manufacturing method of the bottom-gate type thin film transistor array substrate illustrated in FIGS. 1 and 2. The manufacturing method may be carried out as follows as illustrated in FIG. 5.

Step S501, forming a pattern comprising a gate line and a gate electrode on the base substrate.

First, for example, a layer of gate metal film may be formed on the base substrate 10 by sputtering or thermal evaporation. Before forming the gate metal film, it is possible to form a buffer layer on the base substrate 10 first.

Next, a layer of photoresist is coated on the gate metal film and masked and exposed with a mask plate having a pattern corresponding to a gate line 20 and a gate electrode 21, developed, etched, and finally removed to form the pattern comprising the gate line 20 and the gate electrode 21.

Step S502, forming a first insulating layer on the pattern of the gate line and the gate electrode.

For example, the first insulating layer 22 may be formed on the pattern of the gate line 20 and the gate electrode 21 by plasma enhanced chemical vapor deposition (PECVD).

Step S503, forming a pattern of an active layer, a drain electrode and a pixel electrode on the first insulating layer.

First, for example, a layer of metal oxide semiconductor may be formed on the first insulating layer 22 by sputtering.

Secondly, a layer of photoresist is coated on the metal oxide semiconductor and then masked and exposed with a mask having a pattern corresponding to an active layer 31, a drain electrode 32 and a pixel electrode 33, developed, etched, and finally removed to form a pattern comprising the active layer 31, the drain electrode 32 and the pixel electrodes 33 disposed in the same layer.

Step S504, forming a pattern comprising a data line and a source electrode on the pattern of the active layer, the drain electrode and the pixel electrode, with the source electrode being connected with the active layer.

First, for example, a layer of data line metal film is formed on the active layer 31, the drain electrode 32 and the pixel electrode 33 by sputtering or thermal evaporation.

Secondly, a layer of photoresist is coated on the data line metal film, and then masked and exposed with a mask plate having a pattern corresponding to a data line 60 and a source electrode 61, developed, etched, and finally removed to form the data line 60 and the source electrode 61, and the source electrode 61 is directly connected with the active layer 31.

Step S505, forming a passivation layer on the pattern of the data line and the source electrode.

When the material for the passivation layer 71 is silicon nitride or silicon oxide, a passivation layer 71 may be formed on the pattern of the data line 60 and the source electrode 61 by PECVD. When the material for the passivation layer 71 is an organic resin, it is possible to coat the organic resin directly on the data line 60 and the source electrode 61 to form the passivation layer 71.

Further, it is also possible to coat a layer of photoresist on the passivation layer 71 and mask it with a mask having a pattern corresponding to an opening 72 corresponding to the pixel electrode 33. After one patterning process, the opening 72 corresponding to the pixel electrode 33 is formed in the passivation layer 71 to expose the pixel electrode 33.

Embodiment IV

Figure 6:
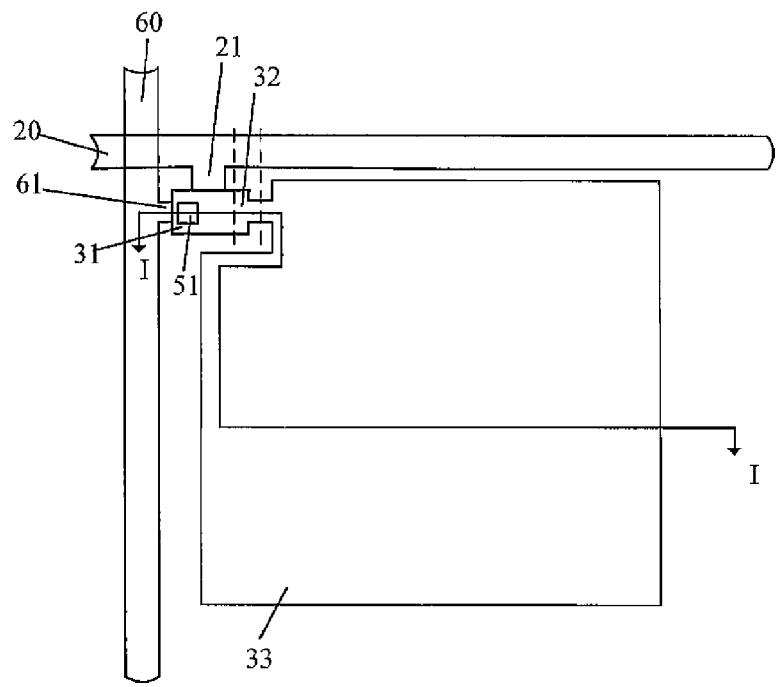
FIG. 6 is a plan view of an array substrate for a top-gate type thin film transistor in an embodiment of the present invention.
Figure 7:
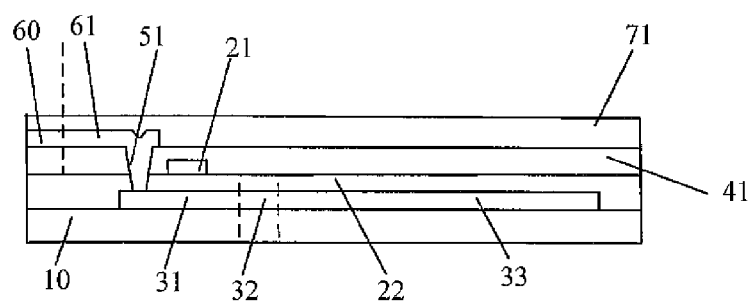
FIG. 7 is a sectional, view along I-I' direction of the array substrate for a top-gate type thin film transistor illustrated in FIG. 6 in an embodiment of the present invention.

The present embodiment provides an array substrate comprises a top-gate type thin film transistor, as illustrated in FIGS. 6 and 7. The top-gate type thin film transistor array substrate comprises: an active layer 31, a drain electrode 32 and a pixel electrode 33 on the base substrate 10; a first insulating layer 22 on the active layer 31, the drain electrode 32 and the pixel electrode 33; a gate line 20 and a gate electrode 21 on the first insulating layer 22; a second insulating layer 41 on the gate line 20 and the gate electrode 21; a data line 60 and a source electrode 61 on the second insulating layer 41; and a passivation layer 71 on the data line 60 and a source electrode 61. The first insulating layer 22 and the second insulating layer 41 are provided therein with a via hole 51 corresponding to the active layer 31, through which the source electrode 61 of the thin film transistor is connected with the active layer 31. More specifically, the structure of the array substrate is as described below.

The base substrate 10 is preferably a glass substrate or a plastic substrate with good light transmittance.

The active layer 31, the drain electrode 32 and the pixel electrode 33 disposed in the same layer on the base substrate 10 may be of the same metal oxide semiconductor, for example, a transparent metal oxide semiconductor materials such as non-crystalline indium gallium zinc oxide, indium zinc oxide, zinc oxide, titanium dioxide, tin oxide, or cadmium stannate or the like metal oxides. Furthermore, the thickness of the active layer 31, the drain electrode 32 and the pixel electrode 33 disposed in the same layer may be from 20 Å to 1000 Å. The active layer 31, the drain electrode 32 and the pixel electrode 33 disposed in the same layer may be directly provided on the base substrate 10. It is also possible to provide a buffer layer between the active layer 31, the drain electrode 32 and the pixel electrode 33 disposed in the same layer and the base substrate 10, which may be of silicon nitride or silicon oxide.

The first insulating layer 22 on the active layer 31, the drain electrode 32 and the pixel electrode 33 may be of a material such as silicon nitride, silicon oxide or silicon oxynitride, and may be of a single-layer structure or a two-layer structure of silicon nitride or silicon oxide. The thickness of the first insulating layer 22 in embodiments of the present invention is for example from 2000 Å to 6000 Å.

The gate line 20 and the gate electrode 21 on the first insulating layer 22 may be of a single-layer structure or a multi-layer structure. When the gate line 20 and the gate electrode 21 are of a single-layer structure, they may be formed of a material such as copper, aluminum, silver, molybdenum, chromium, neodymium, nickel, manganese, titanium, tantalum, or tungsten or any alloy of the above elements. When the gate line 20 and a gate electrode 21 are of a multi-layer structure, they may be formed of a copper\titanium multi-layered structure, a copper\molybdenum multi-layered structure, a molybdenum\aluminum\molybdenum multi-layered structure. The thickness of gate lines 20 and gate electrodes 21 may be from 2500 Å to 16000 Å.

The second insulating layer 41 on the gate line 20 and gate electrode 21 may be of a material such as silicon nitride, silicon oxide or silicon oxynitride, and may be of a single-layer structure or a two-layer structure of silicon nitride or silicon oxide. The thickness of the second insulating layer 41 in embodiments of the present invention is for example from 400 Å to 5000 Å.

The first insulating layer 22 and the second insulating layer 41 are provided therein with a via hole corresponding to the active layer 31.

The data line 60 and the source electrode 61 on the first insulating layer 22 and the second insulating layer 41 are connected with the active layer 31 through the via hole 51. The data line 60 and the source electrode 61 may be of a single-layer structure or a multi-layer structure. When the data line 60 and source electrode 61 are of a single-layer structure, they may be formed of a material such as copper, aluminum, silver, molybdenum, chromium, neodymium, nickel, manganese, titanium, tantalum, or tungsten or any alloy of the above elements. When the data line 60 and the source electrode 61 are of a multi-layer structure, they may be formed of a copper\titanium multi-layered structure, a copper\molybdenum multi-layered structure, or a molybdenum\aluminum\molybdenum multi-layered structure. Furthermore, the thickness of the data line 60 and the source electrode 61 is for example from 2000 Å to 6000 Å.

The passivation layer 71 on the data line 60 and the source electrode 61 may be of a single-layer structure of silicon nitride, silicon oxide or silicon oxynitride or may be of a two-layer structure of silicon nitride or silicon oxide. Furthermore, the material for the passivation layer 71 may also be am organic resin, such as acrylic resin, polyimide and polyamide. The thickness of the passivation layer 71 is for example from 200 Å to 5000 Å.

Figure 8:
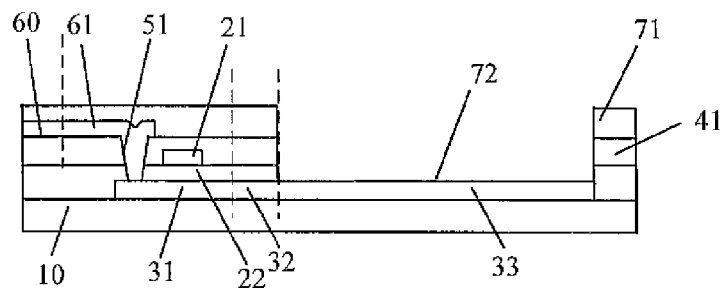
FIG. 8 is a schematic diagram of an array substrate for another top-gate type thin film transistor in an embodiment of the present invention.

Furthermore, as illustrated in FIG. 8, in order to reduce the thickness between the pixel electrode 33 and the liquid crystal molecule layer and further lower the operating voltage for driving liquid crystal molecules, an opening 72 corresponding to the pixel electrodes 33 may be disposed in the passivation layer 71.

Figure 9:
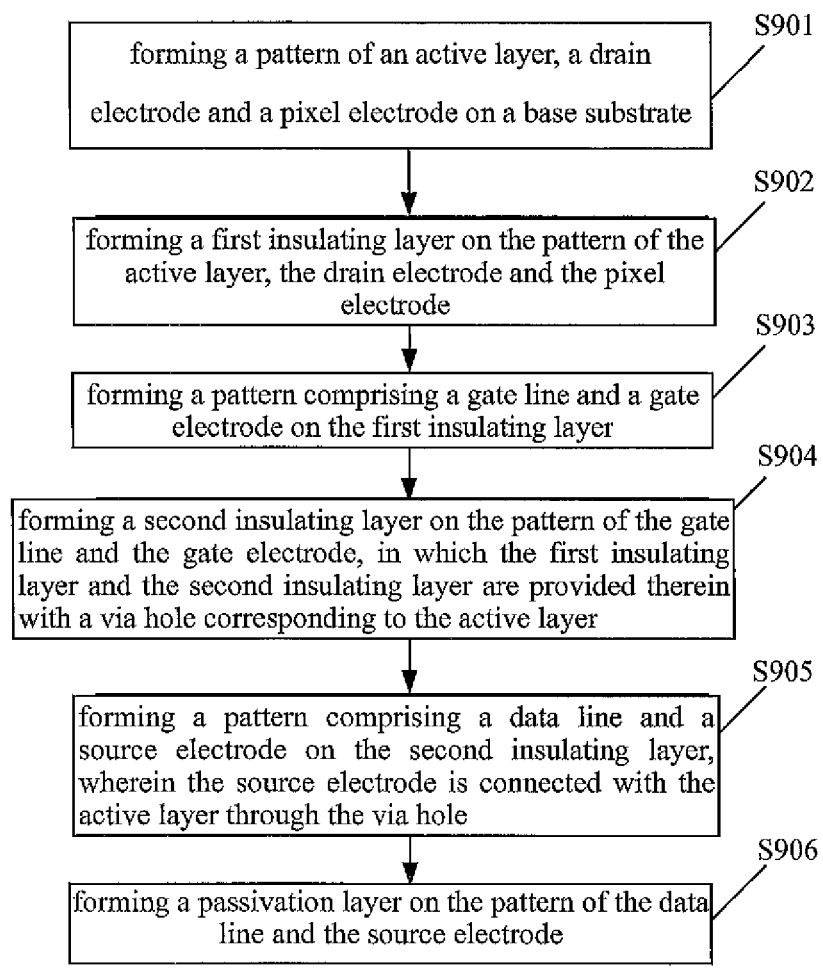
FIG. 9 is a flow chart of a manufacturing method of an array substrate for a top-gate type thin film transistor in an embodiment of the present invention.

The present embodiment further provides a manufacturing method of an array substrate of top-gate type thin film transistors. As illustrated in FIG. 9, the manufacturing method may be implemented as follows.

Step S901, forming a pattern of an active layer, a drain electrode and a pixel electrode on a base substrate.

First, a layer of metal oxide semiconductor is directly formed on the base substrate 10 by a method such as sputtering, and it is also possible to form a buffer layer before forming the metal oxide semiconductor.

Secondly, a layer of photoresist is coated on the metal oxide semiconductor and then masked and exposed with a mask plate having a pattern corresponding to an active layer 31, a drain electrode 32 and a pixel electrode 33, developed, etched, and finally removed to form a pattern comprising the active layer 31, the drain electrode 32 and the pixel electrode 33 disposed in the same layer.

Step S902, forming a first insulating layer on the pattern of the active layer, the drain electrode and the pixel electrode.

For example, the first insulating layer 22 may be formed on the pattern of the active layer 31, the drain electrode 32 and the pixel electrode 33 by a method such as PECVD.

Step S903, forming a pattern comprising a gate line and a gate electrode on the first insulating layer.

First, for example, a layer of gate metal film may be formed on the first insulating layer 22 with sputtering or thermal evaporation.

Next, a layer of photoresist is coated on the gate metal film and masked and exposed with a mask having a patterns corresponding to a gate line 20 and a gate electrode 21, developed, etched, and finally removed, to form a pattern comprising the gate line 20 and the gate electrode 21.

Step S904, forming a second insulating layer on the pattern of the gate line and the gate electrode, in which the first insulating layer and the second insulating layer are provided therein with a via hole corresponding to the active layer.

For example, the second insulating layer 41 is formed on gate lines 20 and gate electrodes 21 by a method such as PECVD.

A layer of photoresist is coated on the second insulating layer 41 and masked and exposed with a mask having a via hole pattern, developed, etched, and finally removed to form a pattern of a via hole 51 corresponding to the active layer 31.

Step S905, forming a pattern comprising a data line and a source electrode on the second insulating layer, wherein the source electrode is connected with the active layer through the via hole.

First, for example, a layer of data line metal film may be formed on the second insulating layer 41 by sputtering or thermal evaporation.

Secondly, a layer of photoresist is coated on the data line metal film, and then masked and exposed with a mask having a pattern corresponding to a data line 60 and a source electrode 61, developed, etched, and finally removed to form the data line 60 and a source electrode 61; the source electrode 61 is connected with the active layer 31 through the via hole 51.

For example, step S906, forming a passivation layer on the pattern of the data line and the source electrode.

When the material for the passivation layer 71 is silicon nitride or silicon oxide, a layer of passivation layer 71 may be formed on the data line 60 and the source electrode 61 by a method such as PECVD. When the material for the passivation layer 71 is an organic resin, it is possible to coat the organic resin directly on the data line 60 and the source electrode 61 to form the passivation layer 71.

Further, it is also possible to coat a layer of photoresist on the passivation layer 71 and mask it with a mask having a pattern of an opening 72 corresponding to the pixel electrode 33. After one patterning process, the opening 72 corresponding to the pixel electrodes 33 is formed on the passivation layer 71 to expose the pixel electrode 33.

Embodiment V

In addition, the present embodiment further provides an array substrate that is an advanced super dimensional switching technology (ADS) type array substrate. The ADS type array substrates may also be classified into bottom-gate type thin film transistor array substrates and top-gate type thin film transistor array substrates.

Figure 10:
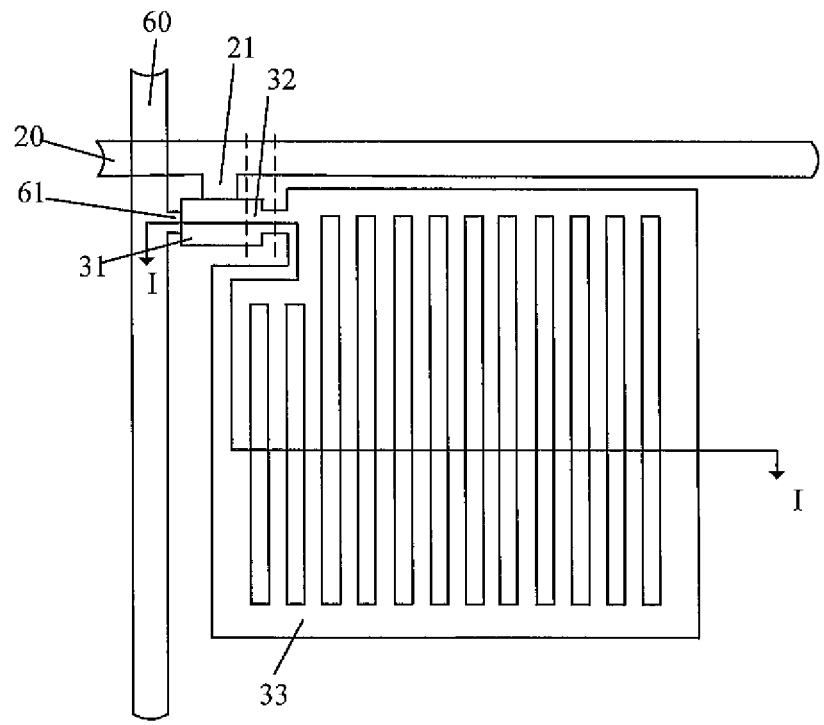
FIG. 10 is a plan view of an advanced super dimensional switching technology array substrate for a bottom-gate type thin film transistor in an embodiment of the present invention.
Figure 11:
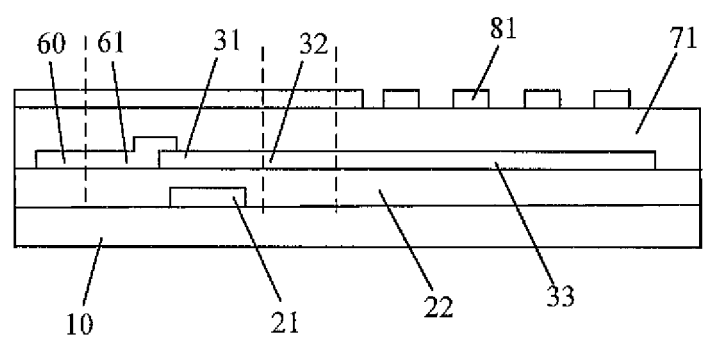
FIG. 11 is a sectional view along I-I' direction of the advanced super dimensional switching technology array substrate for a bottom-gate type thin film transistor illustrated in FIG. 10 in an embodiment of the present invention.

The present embodiment provides an ADS type array substrate comprising bottom-gate type thin film transistors, as illustrated in FIGS. 10 and 11. The array substrate includes: a base substrate 10; gate lines 20 and gate electrodes 21 on the base substrate 10; a first insulating layer 22 on the gate lines 20 and the gate electrodes 21; active layers 31, drain electrodes 32 and pixel electrodes 33 disposed in the same layer on the first insulating layer 22; data lines 60 and source electrodes 61 on the active layers 31, drain electrodes 32 and pixel electrodes 33; a passivation layer 71 on the data lines 60 and the source electrodes 61; and common electrodes 81 on the passivation layer 71.

The base substrate 10 is preferably a glass substrate or a plastic substrate with good light transmittance.

Gate lines 20 and gate electrodes 21 on the base substrate 10 may be of a single-layer structure or a multi-layer structure. When the gate lines 20 and gate electrodes 21 are of a single-layer structure, they may be formed of materials such as copper, aluminum, silver, molybdenum, chromium, neodymium, nickel, manganese, titanium, tantalum, or tungsten or any alloy of the above elements. When gate lines 20 and gate electrodes 21 are of a multi-layer structure, they may be formed of a copper\titanium multi-layered structure, a copper\molybdenum multi-layered structure, or a molybdenum\aluminum\molybdenum multi-layered structure. The thickness of gate lines 20 and gate electrodes 21 is for example from 2500 Å to 16000 Å. The gate lines 20 and the gate electrodes 21 may be located on the base substrate 10 directly, or a buffer layer may be disposed between the gate lines 20 and gate electrodes 21 and the base substrate 10 and may be of for example silicon nitride or silicon oxide.

The first insulating layer 22 on the gate lines 20 and gate electrodes 21 may be of a material such as silicon nitride, silicon oxide or silicon oxynitride, and may be of a single-layer structure or a two-layer structure of silicon nitride or silicon oxide. The thickness of the first insulating layer 22 in embodiments of the present invention is for example from 2000 Å to 6000 Å.

The active layers 31, the drain electrodes 32 and the pixel electrodes 33 disposed in the same layer on the first insulating layer 22 may be of the same metal oxide semiconductor, for example, a transparent metal oxide semiconductor materials such as non-crystalline indium gallium zinc oxide, indium zinc oxide, zinc oxide, titanium dioxide, tin oxide, or cadmium stannate or the like metal oxides. Furthermore, the thickness of the active layers 31, the drain electrodes 32 and the pixel electrodes 33 disposed in the same layer is for example from 20 Å to 1000 Å.

Data lines 60 and source electrodes 61 on the active layers 31, the drain electrodes 32 and the pixel electrodes 33 may be of a single-layer structure or a multi-layer structure. When the data lines 60 and source electrodes 61 are of a single-layer structure, they may be formed of materials such as copper, aluminum, silver, molybdenum, chromium, neodymium, nickel, manganese, titanium, tantalum, or tungsten or any alloy of the above elements. When the data lines 60 and the source electrodes 61 are of a multi-layer structure, they may be made of copper\titanium, copper\ molybdenum, or molybdenum\aluminum\molybdenum. Furthermore, the thickness of data lines 60 and source electrodes 61 is for example from 2000 Å to 6000 Å.

The passivation layer 71 on the data lines 60 and the source electrodes 61 may be of a single-layer structure of silicon nitride, silicon oxide or silicon oxynitride or may be of a two-layer structure of silicon nitride or silicon oxide. Furthermore, the materials for the passivation layer 71 may also be an organic resin, such as acrylic resin, polyimide and polyamide. The thickness of the passivation layer 71 is for example from 200 Å to 5000 Å.

Common electrodes 81 on the passivation layer 71 may be in one integral structure covering all pixels on the array substrate. The common electrodes 81 may be of a transparent conducting material such as indium tin oxide and indium zinc oxide. The thickness of common electrodes 81 is for example from 300 Å to 1500 Å. Furthermore, the positions of the common electrodes 81 relative to the pixel electrodes 33 may be set according to actual situation, which is not specifically limited in embodiments of the present invention. For example, common electrodes 81 may be over pixel electrodes 33 on the array substrate, or may be under pixel electrodes 33. When the common electrodes 81 are over the pixel electrodes 33, there are slits in the common electrodes 81. When the common electrodes 81 are under the pixel electrodes 33, there are slits in the pixel electrodes 33.

Figure 12:
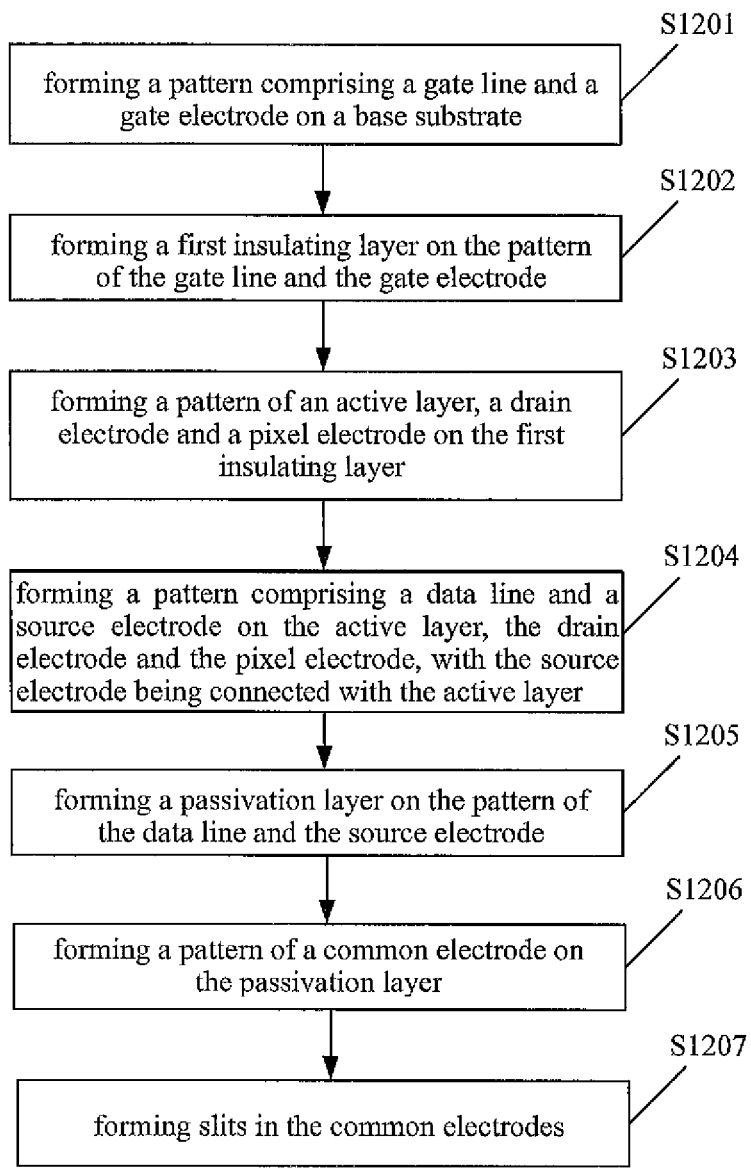
FIG. 12 is a flow chart of a manufacturing method of an advanced super dimensional switching technology array substrate for a bottom-gate type thin film transistor in an embodiment of the present invention.

An embodiment of the present invention further provides a manufacturing method of an ADS type array substrate comprising bottom-gate type thin film transistors. As illustrated in FIG. 12, the manufacturing method may be implemented as follows.

Step S1201, forming a pattern comprising a gate line and a gate electrode on a base substrate.

First, for example, a layer of gate metal film may be formed on the base substrate 10 by sputtering or thermal evaporation. Before forming the gate metal film, it is possible to form a buffer layer on the base substrate 10.

Next, a layer of photoresist is coated on the gate metal film and masked and exposed with a mask having a pattern corresponding to a gate line 20 and a gate electrode 21, developed, etched, and finally removed, to form a pattern comprising the gate line 20 and the gate electrode 21.

Step S1202, forming a first insulating layer on the pattern of the gate line and the gate electrode.

For example, the first insulating layer 22 may be formed on the pattern of the gate line 20 and the gate electrode 21 by a method such as PECVD.

Step S1203, forming a pattern of an active layer, a drain electrode and a pixel electrode on, the first insulating layer.

First, for example, a layer of metal oxide semiconductor may be formed on the first insulating layer 22 by a method such as sputtering.

Secondly, a layer of photoresist is coated on the metal oxide semiconductor and then masked and exposed with a mask having a pattern corresponding to an active layer 31, a drain electrode 32 and a pixel electrode 33, developed, etched, and finally removed to form the pattern comprising the active layer 31, the drain electrode 32 and the pixel electrode 33 disposed in the same layer.

Step S1204, forming a pattern comprising a data line and a source electrode on the active layer, the drain electrode and the pixel electrode, with the source electrode being connected with the active layer.

First, for example, a layer of data line metal film is formed on the active layer 31, the drain electrode 32 and the pixel electrode 33 by sputtering or thermal evaporation.

Secondly, a layer of photoresist is coated on the data line metal film, and then masked and exposed with a mask having a pattern corresponding to a data line 60 and a source electrode 61, developed, etched, and finally removed to form the data line 60 and the source electrode 61. The source electrode 61 is directly connected with the active layer 31.

Step S1205, forming a passivation layer on the pattern of the data line and the source electrode.

For example, when the material for the passivation layer 71 is silicon nitride or silicon oxide, a layer of passivation layer 71 may be formed on the pattern of the data line 60 and the source electrode 61 by PECVD. When the material for the passivation layer 71 is an organic resin, for example, it is possible to coat the organic resin directly on the data line 60 and the source electrode 61 to form the passivation layer 71.

Step S1206, forming a pattern of a common electrode on the passivation layer.

First, for example, a layer of common electrode layer may be formed on the passivation layer 71 by a method such as sputtering or thermal evaporation.

Secondly, a layer of photoresist is coated on the common electrode layer, and then masked and exposed etched with a mask having a pattern corresponding to the common electrode 81, developed, and finally removed to form the common electrode 81.

Step S1207, forming slits in the common electrodes.

A layer of photoresist is coated on the common electrodes 81, and then masked and exposed with a mask having a pattern corresponding to slits, developed, etched, and finally removed to form the slits in the common electrode 81.

The above manufacturing method of ADS type array substrate comprising bottom-gate type thin film transistors is the manufacturing method for common electrodes 81 over pixel electrodes 33. Since the position of the common electrodes 81 relative to the pixel electrodes 33 may be set according to actual situations, the manufacturing method of ADS type array substrate of bottom-gate type thin film transistors may also be determined according to actual situations.

Embodiment VI

Figure 13:
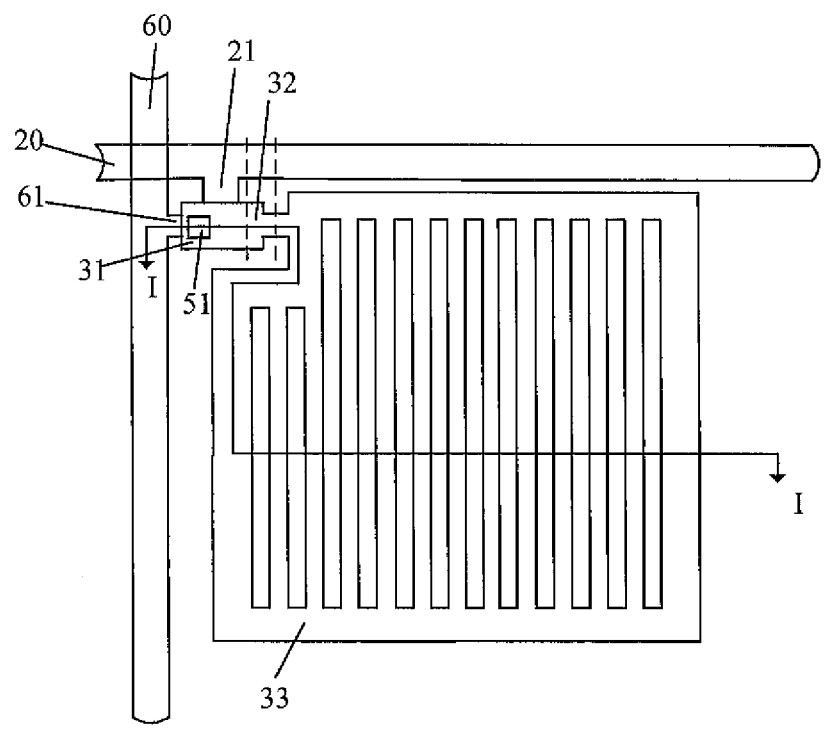
FIG. 13 is a plan view of an advanced super dimensional switching technology array substrate for a top-gate type thin film transistor in an embodiment of the present invention.
Figure 14:
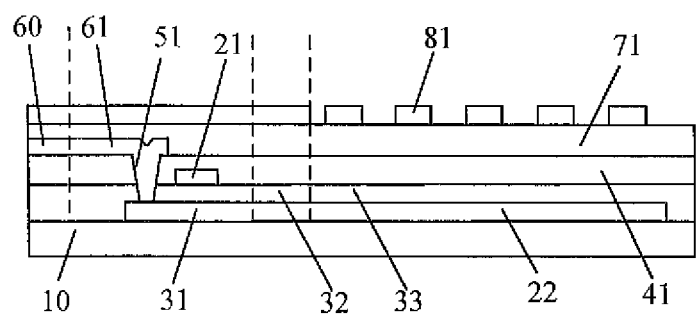
FIG. 14 is a sectional view along I-I' direction of the advanced super dimensional switching technology array substrate for a top-gate type thin film transistor illustrated in FIG. 13 in an embodiment of the present invention.

The present embodiment further provides an ADS type array substrate comprising top-gate type thin film transistors, as illustrated in FIGS. 13 and 14. Specifically, the ADS type array substrate of top-gate type thin film transistors includes: a base substrate 10; active layers 31, drain electrodes 32 and pixel electrodes 33 disposed in the same layer on the base substrate 10; a first insulating layer 22 on the active layers 31, the drain electrodes 32 and pixel electrodes 33; gate lines 20 and gate electrodes 21 on the first insulating layer 22; a second insulating layer 41 on the gate lines 20 and the gate electrodes 21; data lines 60 and source electrodes 61 on the first insulating layer 22 and the second insulating layer 41; a passivation layer 71 on the data lines 60 and the source electrodes 61; and common electrodes 81 on the passivation layer 71.

The base substrate 10 is preferably a glass substrate or a plastic substrate with good light transmittance.

The active layers 31, the drain electrodes 32 and the pixel electrodes 33 may be of the same metal oxide semiconductor, for example, transparent metal oxide semiconductor materials such as non-crystalline indium gallium zinc oxide, indium zinc oxide, zinc oxide, titanium dioxide, tin oxide, or cadmium stannate or the like metal oxides. Furthermore, the thickness of the active layer 31, the drain electrode 32 and the pixel electrode 33 disposed in the same layer is for example from 20 Å to 1000 Å. The active layers 31, drain electrodes 32 and pixel electrodes 33 disposed in the same layer may be directly provided on the base substrate 10. It is also possible to provide a buffer layer between the active layer 31, drain electrodes 32 and pixel electrodes 33 disposed in the same layer and the base substrate 10, which may be of silicon nitride or silicon oxide.

The first insulating layer 22 may be of a material such as silicon nitride, silicon oxide or silicon oxynitride, and may be of a single-layer structure or a two-layer structure of silicon nitride or silicon oxide. The thickness of the first insulating layer 22 in embodiments of the present invention is from 2000 Å to 6000 Å.

The gate lines 20 and the gate electrodes 21 may be of a single-layer structure or a multi-layer structure. When the gate lines 20 and gate electrodes 21 are of a single-layer structure, they may be formed of materials such as copper, aluminum, silver, molybdenum, chromium, neodymium, nickel, manganese, titanium, tantalum, or tungsten or any alloy of the above elements. When gate lines 20 and gate electrodes 21 are of a multi-layer structure, they may be formed of a copper\titanium multi-layered structure, a copper\molybdenum multi-layered structure, or a molybdenum\aluminum\molybdenum multi-layered structure. The thickness of gate lines 20 and gate electrodes 21 is for example from 2500 Å to 16000 Å.

The second insulating layer 41 may be of a material such as silicon nitride, silicon oxide or silicon oxynitride, and may be of a single-layer structure or a two-layer structure of silicon nitride or silicon oxide. The thickness of the second insulating layer 41 in embodiments of the present invention is for example from 400 Å to 5000 Å.

The first insulating layer 22 and the second insulating layer 41 are provided therein with via holes 51 corresponding to the active layers 31.

The source electrodes 61 are connected with the active layer 31 through the via holes 51. Data lines 60 and source electrodes 61 may be of a single-layer structure or a multi-layer structure. When the data lines 60 and source electrodes 61 are of a single-layer structure, they may be formed of a material such as copper, aluminum, silver, molybdenum, chromium, neodymium, nickel, manganese, titanium, tantalum, or tungsten or any alloy of the above elements. When data lines 60 and source electrodes 61 are of a multi-layer structure, they may be formed of a copper\titanium multi-layered structure, a copper\molybdenum multi-layered structure, or a molybdenum\aluminum\molybdenum multi-layered structure. Furthermore, the thickness of data lines 60 and source electrodes 61 is for example from 2000 Å to 6000 Å.

The passivation layer 71 may be of a single-layer structure of silicon nitride, silicon oxide or silicon oxynitride or may be of a two-layer structure of silicon nitride or silicon oxide. Furthermore, the material for the passivation layer 71 may also be an organic resin, such as acrylic resin, polyimide and polyamide. The thickness of the passivation layer 71 is preferably from 200 Å to 5000 Å.

The common electrodes 81 may be of one integral structure covering all pixels on the array substrate. The common electrodes 81 may be of a transparent conducting material such as indium tin oxide and indium zinc oxide. The thickness of common electrodes 81 is for example from 300 Å to 1500 Å. Furthermore, the positions of the common electrodes 81 relative to the pixel electrodes 33 may be set according to practical situation, which is not specifically limited in embodiments of the present invention. For example, common electrodes 81 may be over pixel electrodes 33 on the array substrate, or may be under pixel electrodes 33. When the common electrodes 81 are over the pixel electrodes 33, there are slits in the common electrodes 81. When the common electrodes 81 are under the pixel electrodes 33, there are slits in the pixel electrodes 33.

Figure 15:
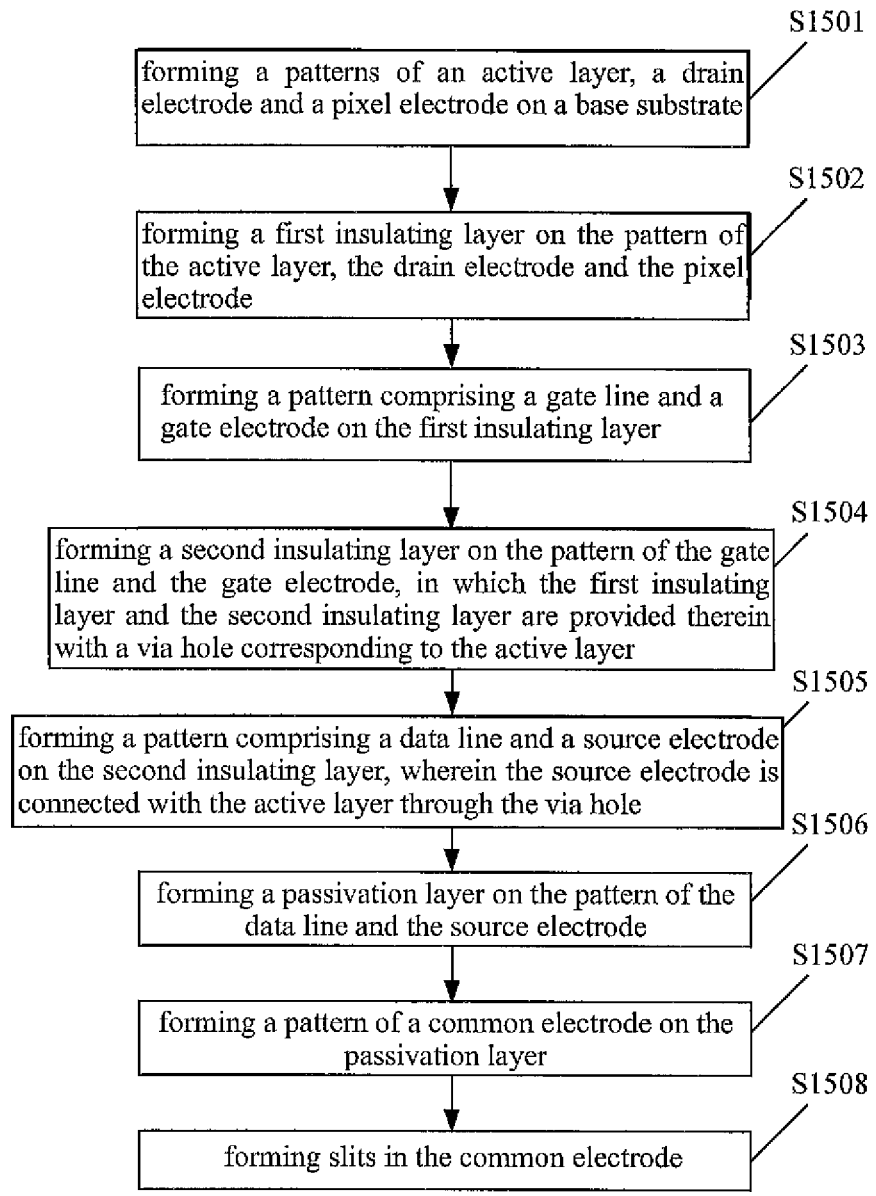
FIG. 15 is a flow chart of a manufacturing method of an advanced super dimensional switching technology array substrate for a top-gate type thin film transistor in an embodiment of the present invention.

The present embodiment further provides a manufacturing method of an ADS type array substrate of top-gate type thin film transistors. As illustrated in FIG. 15, the manufacturing method may be implemented as follows.

Step S1501, forming a patterns of an active layer, a drain electrode and a pixel electrode on a base substrate.

First, a layer of metal oxide semiconductor is directly formed on the base substrate 10 by a method such as sputtering, and it is also possible to form a buffer layer before forming the metal oxide semiconductor.

Secondly, a layer of photoresist is coated on the metal oxide semiconductor and then masked and exposed with a mask having a pattern corresponding to an active layer 31, a drain electrode 32 and a pixel electrode 33, developed, etched, and finally removed to form the pattern comprising the active layer 31, the drain electrode 32 and the pixel electrode 33 disposed in the same layer.

Step S1502, forming a first insulating layer on the pattern of the active layer, the drain electrode and the pixel electrode.

For example, the first insulating layer 22 may be formed on the active layer 31, the drain electrode 32 and the pixel electrode 33 by a method such as PECVD.

Step S1503, forming a pattern comprising a gate line and a gate electrode on the first insulating layer.

First, for example, a layer of gate metal film may be formed on the first insulating layer 22 by sputtering or thermal evaporation.

Next, a layer of photoresist is coated on the gate metal film and masked and exposed with a mask having a pattern corresponding to a gate line 20 and a gate electrode 21, developed, etched and finally removed, to form the pattern comprising the gate line 20 and the gate electrode 21.

Step S1504, forming a second insulating layer on the pattern of the gate line and the gate electrode, in which the first insulating layer and the second insulating layer are provided therein with a via hole corresponding to the active layer.

For example, the second insulating layer 41 is formed on gate lines 20 and gate electrodes 21 by a method such as PECVD.

A layer of photoresist is coated on the second insulating layer 41 and masked and exposed with a mask having a via hole pattern, developed, etched, and finally removed to form the pattern comprising a via hole 51.

Step S1505, forming a pattern comprising a data line and a source electrode on the second insulating layer, wherein the source electrode is connected with the active layer through the via hole.

First, for example, a layer of data line metal film may be formed on the second insulating layer 41 by sputtering or thermal evaporation.

Secondly, a layer of photoresist is coated on the data line metal film, and then masked and exposed with a mask having a pattern corresponding to a data line 60 and a source electrode 61, developed, etched, and finally removed to form the data line 60 and the source electrode 61; the source electrode 61 is connected with the active layer 31 through the via hole 51.

Step S1506, forming a passivation layer on the pattern of the data line and the source electrode.

For example, when the material for the passivation layer 71 is silicon nitride or silicon oxide, a layer of passivation layer 71 may be formed on patterns of data lines 60 and source electrodes 61 by PECVD. When the material for the passivation layer 71 is organic resin, it is possible to coat the organic resin directly on the data line 60 and the source electrode 61 to form the passivation layer 71.

Step S1507, forming a pattern of a common electrode on the passivation layer.

First, for example, a layer of common electrode layer may be formed on the passivation layer 71 by a method such as sputtering or thermal evaporation.

Secondly, a layer of photoresist is coated on the common electrode layer, and then masked and exposed with a mask having a pattern corresponding to a common electrode 81, developed, etched and finally removed to form the common electrode 81.

Step S1508, forming slits in the common electrode.

A layer of photoresist is coated on the common electrodes 81, and then masked and exposed with a mask having a pattern corresponding to slits, developed, etched, and finally removed to form the slits in the common electrode 81.

The above manufacturing method of ADS type array substrate of top-gate type thin film transistors is the manufacturing method for common electrodes 81 over pixel electrodes 33. Since the position of the common electrodes 81 relative to the pixel electrodes 33 may be set according to actual situations, the manufacturing method of ADS type array substrate of top-gate type thin film transistors may also be determined according to actual situations.

What are described above is related to the illustrative embodiments of the disclosure only and not limitative to the scope of the disclosure; the scopes of the disclosure are defined by the accompanying claims.

The invention claimed is:

1. An array substrate comprising a base substrate, a gate line, a data line and a thin film transistor arranged in an array on the base substrate, a pixel electrode and a passivation layer, the thin film transistor comprising a gate electrode, an active layer, a source electrode and a drain electrode,
wherein the pixel electrode and the active layer, the drain electrode are disposed in a same layer and formed integrally,
the thin film transistor is a top-gate type thin film transistor, the array substrate comprises: the active layer, the drain electrode and the pixel electrode on the base substrate; a first insulating layer on the active layer, the drain electrode and the pixel electrode; the gate line and the gate on the first insulating layer; a second insulating layer on the gate line and the gate electrode; the data line and the source electrode on the second insulating layer; and the passivation layer on the data line and the source electrode,
wherein the first insulating layer and the second insulating layer are provided therein with a via hole corresponding to the active layer, and the source electrode of the thin film transistor is connected with the active layer through the via hole;
the source electrode is disposed in a layer different from the pixel electrode, the active layer and the drain electrode.

2. The array substrate of claim 1, wherein the first insulating layer, the second insulating layer and the passivation layer further comprise an opening corresponding to the pixel electrode.

3. The array substrate of claim 1, further comprising a common electrode on the passivation layer.

4. The array substrate of claim 3, wherein the common electrode has slits therein.

5. The array substrate of claim 1, wherein a material for the active layer, the drain electrode and the pixel electrode is a metal oxide semiconductor material; and a thickness of the active layer, the drain electrode and the pixel electrode is from 20 Å to 1000Å.

6. A display device comprising the array substrate of claim 1.

7. The array substrate of claim 1, further comprising a common electrode on the passivation layer.

8. A manufacturing method of an array substrate comprising a base substrate, a gate line, a data line, a top-gate type thin film transistor arranged in an array on the base substrate, a pixel electrode and a passivation layer, the top-gate type thin film transistor comprising a gate electrode, an active layer, a source electrode and a drain electrode, the method comprising:
forming a pattern comprising the active layer, and the drain electrode and the pixel electrode, and the pixel electrode, the active layer, the drain electrode being disposed in a same layer and formed integrally;
the manufacturing method further comprises:
forming a pattern of the active layer, the drain electrode and the pixel electrodes on the base substrate;
forming a first insulating layer on the pattern of the active layer, the drain electrode and the pixel electrode;
forming a pattern comprising the gate line and the gate electrode on the first insulating layer;
forming a second insulating layer on the pattern of the gate line and the gate electrode, the first insulating layer and the second insulating layer being provided therein with a via hole corresponding to the active layer;
forming a pattern comprising the data line and the source electrode on the second insulating layer, the source electrode being connected with the active layer through the via hole;
forming the passivation layer on the pattern of the data line and the source electrode;
the source electrode is disposed in a layer different from the pixel electrode, the active layer and the drain electrode.

9. The manufacturing method of claim 8, further comprising:
forming the openings corresponding to the pixel electrode in the first insulating layer, the second insulating layer and the passivation layer.

10. The manufacturing method of claim 8, further comprising:
forming a patterns of a common electrode on the passivation layer.

11. The manufacturing method of claim 10, further comprising:
forming slits in the common electrode.

12. The manufacturing method of claim 8, wherein
the active layer, the drain electrode and the pixel electrode are formed of a metal oxide semiconductor material; and
a thickness of the active layer, the drain electrode and the pixel electrode is from 20 Å to 1000Å.

13. The manufacturing method of claim 8, further comprising:
forming a patterns of a common electrode on the passivation layer.

* * * * *